United States Patent [19]
Johnson et al.

[11] Patent Number: 5,231,561
[45] Date of Patent: Jul. 27, 1993

[54] MOUNTING METHOD AND APPARATUS FOR PWA SHIELDING

[75] Inventors: Robert A. Johnson, Seguin; Edward L. Saxton, Buda; Kimberly A. Kirkham, Seguin; Andrew W. Hardell; Kenneth M. Zoric, both of Austin, all of Tex.; Eduardo M. Molieri, Mesa, Ariz.

[73] Assignee: Motorola, Inc., Schaumburg, Ill.

[21] Appl. No.: 836,500

[22] Filed: Feb. 18, 1992

[51] Int. Cl.5 .............................. H05K 9/00
[52] U.S. Cl. .................. 361/424; 174/35 R; 361/427; 361/429
[58] Field of Search ............. 174/35 R, 35 GC; 361/392, 380, 394, 395, 399, 424, 427, 429; 379/100; 439/108, 607, 609

[56] References Cited
U.S. PATENT DOCUMENTS

| | | | |
|---|---|---|---|
| 4,661,888 | 4/1987 | Jewell et al. | 361/424 |
| 4,737,597 | 4/1988 | Tomiya et al. | 174/35 R |
| 4,780,570 | 10/1988 | Chuck | 174/35 GC |
| 4,821,145 | 4/1989 | Corfits et al. | 361/424 |
| 4,835,598 | 5/1989 | Higuchi et al. | 357/72 |
| 4,872,212 | 10/1989 | Roos et al. | 361/424 |
| 4,910,434 | 3/1990 | Doumani et al. | 315/3 |
| 5,025,116 | 6/1991 | Kawakami et al. | 174/250 |
| 5,030,800 | 7/1991 | Kawakami et al. | 174/264 |

*Primary Examiner*—Gregory D. Thompson
*Attorney, Agent, or Firm*—Jeffrey D. Nehr

[57] ABSTRACT

A mounting apparatus and method is suitable for printed wiring assembly (PWA) shielding in an electrical device such as a facsimile machine. The mounting comprises a frame including a substantially flat frame floor, at least one PWA edge card connector, and at least one frame fastener. Continuous shielding walls are positioned immediately adjacent to the frame floor, and the PWA comprises a substantially flat component-mounting surface and a shielding surface, at least one PWA edge card, and at least one frame fastener receiver. The PWA edge card is inserted into the PWA edge card connector and the frame fastener is coupled to the frame fastener receiver such that the PWA component-mounting surface is held within an electromagnetically-shielded volume bounded by the PWA shielding surface, the shielding walls, and the frame floor.

20 Claims, 2 Drawing Sheets

MOUNTING METHOD AND APPARATUS FOR PWA SHIELDING

FIELD OF THE INVENTION

This invention relates in general to the field of mounting printed wiring assemblies (PWAs), and in particular to mounting PWAs to provide electromagnetic shielding of PWA components.

BACKGROUND OF THE INVENTION

Electromagnetic shielding is important for many electronic products which require electronic circuits and components to be free from electromagnetic interference. Such interference may emanate from sources outside the electronic product or from other circuits or components within the electronic product itself.

Many electromagnetic shields and mounts for these products use screw or similarly fastened shields immediately surrounding PWAs to provide the requisite protection. Screw-mounted shields, however, are relatively tedious to assemble, represent a relatively high part count, and due to the labor necessary for installation, contribute to a relatively high product cost. Electromagnetic shields are often an "add-on" item to the circuit design of an electronic product, rather than integrally designed in the mounting or packaging of the PWAs.

What is needed is a practical, economical mounting apparatus and method for PWA shielding. The development of a new facsimile machine provided an impetus to meet the need for providing mounting and electromagnetic shielding in a low-cost, straightforward manner. The need existed to use only a few simple, yet reliable, parts in the design. The need also existed to devise a method which would allow for easy assembly of the shielded mounting.

SUMMARY OF THE INVENTION

Accordingly, it is an advantage of the present invention to provide a new and improved mounting apparatus for PWA shielding. It is a further advantage of the present invention to provide a method to mount PWAs to provide shielding as an integral portion of the mounting design. It is a further advantage to provide such mounting and shielding in a low-cost, easy-to-assemble package using a small number of parts and without the use of screw-type fasteners.

To achieve these advantages, a mounting for electromagnetically shielding a printed wiring assembly (PWA) is contemplated which includes a frame comprising a substantially flat frame floor, at least one PWA edge card connector, and at least one frame fastener; continuous shielding walls positioned immediately adjacent to the frame floor; and the PWA comprising a substantially flat component-mounting surface and a shielding surface, at least one PWA edge card, and at least one frame fastener receiver, wherein the at least one PWA edge card is inserted into the at least one PWA edge card connector and the at least one frame fastener is coupled to the at least one frame fastener receiver such that the PWA edge card connector and the frame fastener hold the PWA component-mounting surface in an enclosed electromagnetically-shielded volume bounded by the PWA shielding surface, the shielding wall means, and the frame floor.

To further achieve these advantages a method for electromagnetically shielding a printed wiring assembly (PWA) in a mounting is contemplated, the method comprising the steps of providing a frame comprising a substantially flat frame floor, at least one PWA edge card connector, and at least one frame fastener, providing continuous shielding walls, positioning the continuous shielding walls immediately adjacent to the frame floor, providing the PWA comprising a substantially flat component-mounting surface and a shielding surface, at least one PWA edge card, and at least one fastener receiver, inserting the at least one PWA edge card into the at least one PWA edge card connector, coupling the at least one frame fastener to the at least one frame fastener receiver such that the PWA edge card connector and the frame fastener hold the PWA component-mounting surface in an enclosed electromagnetically-shielded volume bounded by the PWA shielding surface, the shielding walls, and the frame floor.

The above and other features and advantages of the present invention will be better understood from the following detailed description taken in conjunction with the accompanying drawings.

DETAILED DESCRIPTION OF THE PREFERRED EMBODIMENT

Figure 1:
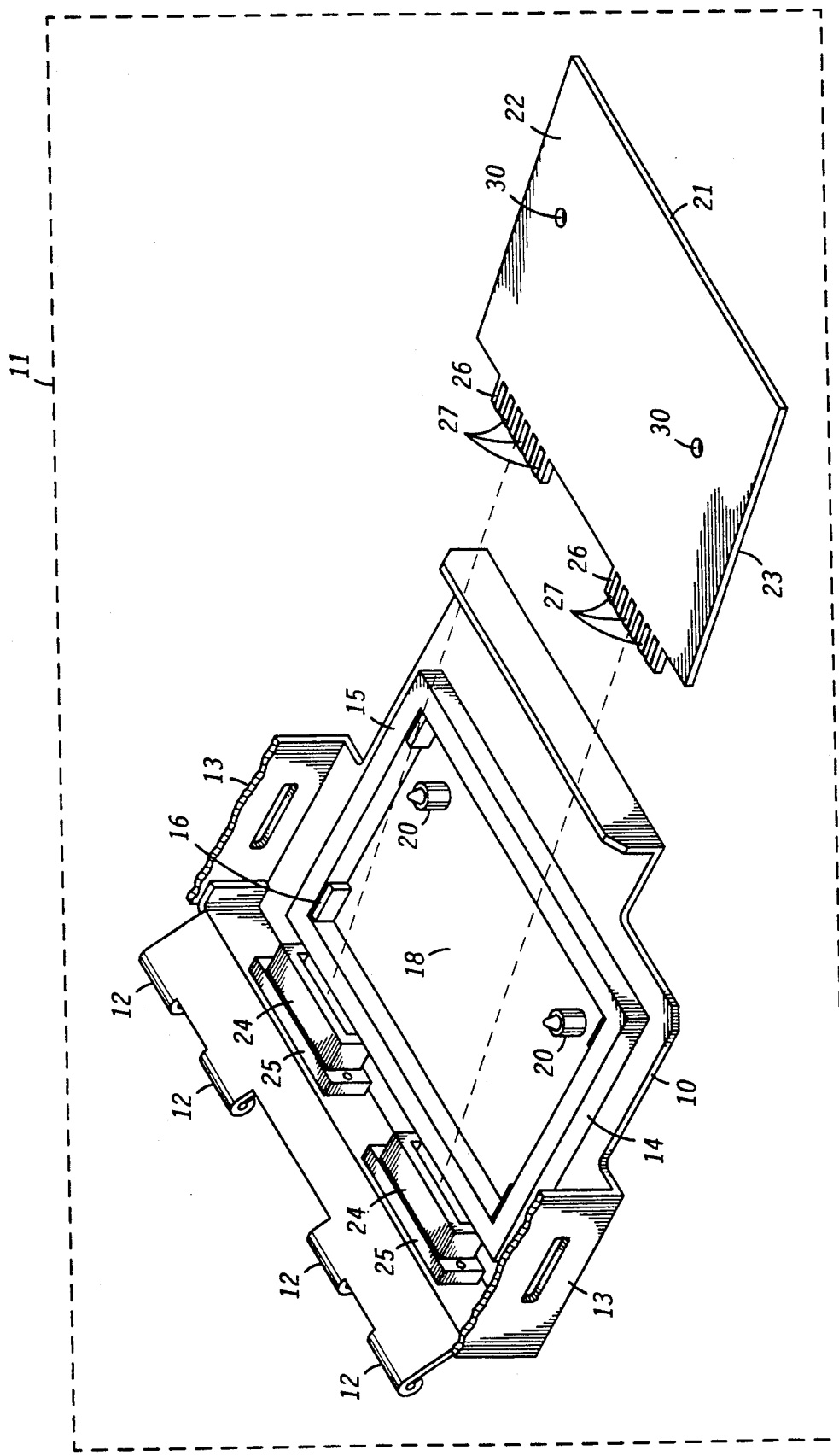
In FIG. 1, there is shown an isometric view of a mounting apparatus and method for PWA shielding in accordance with a preferred embodiment of the invention.

In FIG. 1, the mounting apparatus is shown within electronic device 11, e.g., a facsimile machine. Frame 10 includes mounting brackets 12 and 13 to secure the mounting apparatus within electronic device 11.

Edge card connectors 24 are coupled to frame 10 by edge card connector mountings 25. Although two edge card connectors 24 and edge card connector mountings 25 are shown, there may be a greater number or lesser number of edge card connectors 24 and corresponding edge card connector mountings 25 depending on the PWA 21 and the electronic device 11 used.

Frame 10 comprises a substantially flat surface, i.e., frame floor 18. Frame floor 18 is comprised of electrically-conductive material. Shielding wall 14, comprised of electrically conductive material, is positioned around shielding wall guides 16 which protrude from the frame floor 18. Shielding wall 14 is substantially constant in its thickness above frame floor 18. Shielding wall 14 can be an integral portion of frame floor 18, or can be a separate component placed on frame floor 18. Shielding wall guides 16 prevent shielding wall 14 from moving across the surface of frame floor 18.

In the preferred embodiment represented in FIG. 1, an additional contact strip 15 is placed along the top surface of the shielding wall 14 in FIG. 1, i.e., the surface of shielding wall 14 opposite to where the shielding wall 14 contacts the frame floor 18. The contact strip 15 is comprised of conductive material, for example beryllium-copper and can be present to ensure good electrical contact between the shielding wall 14 and the PWA 21 when the PWA 21 is installed to the frame 10 assembly.

Perpendicular to frame floor 18, extending upward away from the frame floor 18 surface in the same direction as shielding wall 14, are combination standoff/fasteners 20. The standoff portion of combination standoff/fasteners 20 in the preferred embodiment is a cylinder of plastic which extends upward from frame floor 18 a distance equal to that of the height of shielding wall 14 perpendicular to frame floor 18. In the preferred embodiment, the fastener portion of combination standoff/fasteners 20 comprises a plastic snap to accommodate the frame fastener receives which are PWA mounting holes 30 in PWA 21.

PWA 21 is shown in FIG. 1 as a substantially planar mounting board comprising edge cards 26 (each of which comprises edge card contacts 27), electromagnetically shielding surface 22, and printed wiring component-mounting surface 23. Printed wiring components are mounted on the underside surface of PWA 21, i.e., the surface of PWA 21 to be enclosed within the shielded volume of the assembled mounting. Shielding surface 22 thus comprises a "cover" for the volume to be shielded. The shielded space is defined by frame floor 18 as a "base", shielding wall 14 as a continuous enclosing "wall", and shielding surface 22 as a "cover". Printed wiring components 23, mounted on the underside of the PWA 21 "cover", can be connected to edge card contacts 27 to be electrically connected through edge card connectors 24 to electrical circuits or components outside the shielded volume.

Note that, as in the case of the edge card connectors 24, two combination standoff/fasteners 20 are shown in the preferred embodiment, but a greater number or lesser number of combination standoff/fasteners 20 can be used, depending on the area of the PWA 21, the number and size of printed wiring components 23, or other factors.

The method of assembling and mounting the PWA 21 to the frame 10 and contact strip 15 of the shielding wall 14 can be seen in FIG. 1. After edge card connectors 24 are mounted via edge card connector mountings 25 to the frame 10 such that the edge card connectors are oriented parallel to the frame floor 18, and combination standoff/fasteners 20 are fixed perpendicular to frame floor 18, shielding wall 14 is positioned around shielding wall guides 16 in contact with frame floor 18. Contact strip 15 may be placed on the top surface of shielding wall 14 either before or after shielding wall 14 is positioned on frame floor 18.

The dashed lines between edge cards 26 and edge card connectors 24 in FIG. 1 indicate the alignment in the connection of PWA 21 to the frame assembly. Edge card connectors 24 receive edge cards 26 from PWA 21. There is sufficient flexibility within the edge card 26/edge card connector 24 coupling to permit the insertion of edge cards 26 into the edge card connectors 24 at a slight angle with respect to the plane defined by the frame floor 18. Once the edge cards 26 are inserted into the edge card connectors 24, PWA 21 can be pivoted about the edge card 26/edge card connector 24 coupling to align the plane defined by PWA 21 parallel to the plane defined by frame floor 18. In other words, PWA 21 is pivoted downward toward frame floor 18 so that the the surface of PWA 21 on which the printed wiring components 23 are mounted comes into contact with contact strip 15 on top of shielding wall 14. In pivoting PWA 21 against contact strip 15, combination standoff/fasteners 20 align with and snap through PWA mounting holes 30. Thus, PWA 21 is coupled to frame 10 via combination standoff/fasteners 20 and edge card connectors 24, and a shielded volume enclosing the printed wiring component mounting surface 23 is created. The shielded volume is defined by the PWA 21 shielding surface 22, the shielding wall 14, and the frame floor 18.

Figure 2:
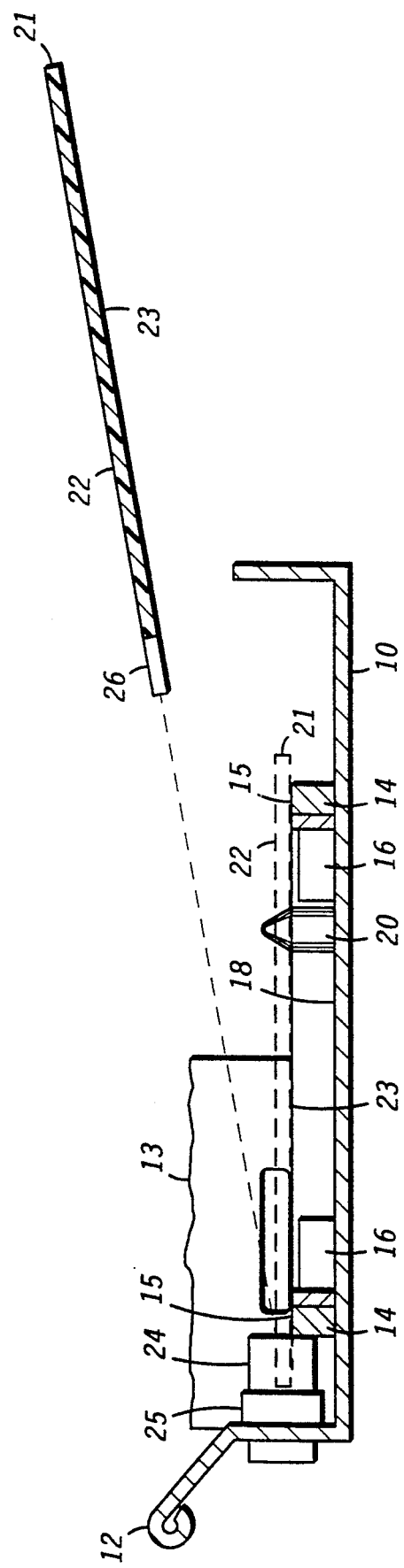
In FIG. 2, there is shown a side cutaway view of the mounting apparatus and method in FIG. 1.

FIG. 2 illustrates the apparatus and method for mounting and shielding the PWA 21 as shown in FIG. 1 in a side, cutaway view. FIG. 2 illustrates frame 10, mounting brackets 12, shielding wall 14, contact strip 15, shielding wall guides 16, frame floor 18, combination standoff/fasteners 20, PWA 21, shielding surface 22, printed wiring component mounting surface 23, edge card connectors 24, edge card connector mountings 25, edge cards 26, and PWA mounting holes 30.

The slight angle with respect to the plane defined by frame floor 18 at which the edge cards 26 of PWA 21 are inserted into edge card connectors 24 can easily be seen in FIG. 2. The position of PWA 21 after installation is shown by the dashed outline of PWA 21 parallel to frame floor 18 in FIG. 2.

Thus, a mounting apparatus and method for PWA shielding has been described which overcomes specific problems and accomplishes certain advantages relative to prior art methods and mechanisms. The mounting apparatus and method for PWA shielding is practical and economical, given its simple design and few number of parts. The electromagnetic shielding comes about as an integral portion of the mounting method, rather than as an "add on" necessitating additional components. Furthermore, the electrical connections between printed wiring components on the PWA and circuits or components outside the shielded enclosure encompassing the printed wiring components on the PWA provide part of the coupling holding the shielded enclosure together. The apparatus is also easy to assemble and does not require the use of screw-type fasteners.

Thus, there has also been provided, in accordance with an embodiment of the invention, a mounting apparatus and method for PWA shielding that fully satisfies the aims and advantages set forth above. While the invention has been described in conjunction with a specific embodiment, many alternatives, modifications, and variations will be apparent to those of ordinary skill in the art in light of the foregoing description. Accordingly, the invention is intended to embrace all such alternatives, modifications, and variations as fall within the spirit and broad scope of the appended claims.

What is claimed is:

1. A combination mounting and printed wiring assembly (PWA) which electromagnetically shields the printed wiring assembly, the combination comprising:
   a frame comprising a substantially flat frame floor, at least one PWA edge card connector, and at least one frame fastener;
   continuous shielding wall means positioned immediately parallel to and coupled to the frame floor to provide shielding; and
   the PWA comprising a substantially planar component-mounting surface and a shielding surface, at least one PWA edge card, and at least one frame fastener receiver, such that when the at least one PWA edge card is inserted into the at least one PWA edge card connector and the at least one frame fastener is fastened to the at least one frame fastener receiver, the PWA is securely held with the component-mounting surface in a electromagnetically-shielded volume, the volume bounded by the PWA shielding surface, the shielding wall means, and the frame floor.

2. A combination mounting and PWA as claimed in claim 1, wherein the frame comprises:
   at least one frame bracket for attaching the frame within an electronic device; and
   a plurality of shielding wall guides for positioning the shielding wall means on the frame floor.

3. A combination mounting and PWA as claimed in claim 1, wherein the at least one frame fastener comprises a combination standoff and snap connector.

4. A combination mounting and PWA as claimed in claim 1, wherein the shielding wall means comprises:
   conductive material; and
   contact strip means in contact with the PWA component-mounting surface.

5. A combination mounting and PWA as claimed in claim 4, wherein the contact strip means comprises a strip of beryllium-copper.

6. A combination mounting and PWA as claimed in claim 1, wherein the shielding wall means is integral to the frame floor.

7. A combination mounting and PWA as claimed in claim 3, wherein the PWA comprises:
   at least one electronic component mounted on the component-mounting surface; and
   at least one PWA mounting hole through the PWA for receiving and fastening to the at least one combination standoff and snap connector.

8. A combination mounting and PWA as claimed in claim 1, wherein each of the at least one edge card and the at least one edge card connector comprise a plurality of edge card contacts.

9. In a facsimile, and electromagnetically shielded combination mounting and printed wiring assembly (PWA), the combination comprising:
   a frame comprising a substantially flat frame floor, at least one PWA edge card connector, and at least one frame fastener;
   continuous shielding wall means positioned immediately parallel to and coupled to the frame floor to provide shielding; and
   the PWA comprising a substantially planar component-mounting surface and a shielding surface, at least one PWA edge card, and at least one frame fastener receiver, such that when the at least one PWA edge card is inserted into the at least one PWA edge card connector and the at least one frame fastener is fastened to the at least one frame fastener receiver, the PWA is securely held with the component-mounting surface in a electromagnetically-shielded volume, the volume bounded by the PWA shielding surface, the shielding wall means, and the frame floor.

10. A combination mounting and PWA as claimed in claim 9, wherein the frame comprises:
    at least one frame bracket for attaching the mounting within the facsimile; and
    a plurality of shielding wall guides for positioning the shielding wall means on the frame floor.

11. A combination mounting and PWA as claimed in claim 9, wherein the at least one frame fastener comprises a combination standoff and snap connector.

12. A combination mounting and PWA as claimed in claim 9, wherein the shielding wall means comprises:
    conductive material; and
    contact strip means in contact with the PWA component-mounting surface.

13. A combination mounting and PWA as claimed in claim 12, wherein the contact strip means comprises a strip of beryllium-copper.

14. A combination mounting and PWA as claimed in claim 9, wherein the shielding wall means is integral to the frame floor.

15. A combination mounting and PWA as claimed in claim 11, wherein the PWA comprises:
    at least one electronic component mounted on the the component-mounting surface; and
    at least one PWA mounting hole through the PWA for receiving and fastening to the at least one combination standoff and snap connector.

16. A combination mounting and PWA as claimed in claim 9, wherein each of the at least one edge card and the at least one edge card connector comprise a plurality of edge card contacts.

17. A method for electromagnetically shielding a printed wiring assembly (PWA) in a mounting, the method comprising the steps of:
    providing a frame comprising a substantially flat frame floor, at least one PWA edge card connector, and at least one frame fastener;
    providing continuous shielding walls;
    positioning the continuous shielding walls to the frame floor;
    providing a PWA comprising a substantially flat component-mounting surface and a shielding surface, at least one PWA edge card, and at least one frame fastener receiver;
    inserting the at least one PWA edge card into the at least one PWA edge card connector; and
    coupling the at least one frame fastener to the at least one frame fastener receiver such that the PWA edge card connector and the frame fastener hold the PWA component-mounting surface in contact with the shielding walls and in an enclosed electromagnetically-shielded volume bounded by the PWA shielding surface, the shielding walls, and the frame floor.

18. A method as claimed in claim 17, wherein the step of positioning comprises the step of aligning the shielding walls around a plurality of shielding wall guides coupled to the frame floor.

19. A method as claimed in claim 17, wherein the step of providing continuous shielding walls comprises the additional step of providing a continuous beryllium copper contact strip between the PWA component-mounting surface and the continuous shielding walls.

20. A method as claimed in claim 17, wherein the step of coupling comprises the step of snapping the at least one frame fastener which comprises a combination plastic standoff and snap connector to the at least one frame fastener receiver which comprises a PWA mounting hole.

* * * * *